United States Patent
Tyan et al.

(10) Patent No.: US 7,268,485 B2
(45) Date of Patent: Sep. 11, 2007

(54) WHITE-EMITTING MICROCAVITY OLED DEVICE

(75) Inventors: Yuan-Sheng Tyan, Webster, NY (US); Steven A. Van Slyke, Pittsford, NY (US); Joel D. Shore, Rochester, NY (US); Giuseppe Farruggia, Webster, NY (US); Thomas R. Cushman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 338 days.

(21) Appl. No.: 10/680,758

(22) Filed: Oct. 7, 2003

(65) Prior Publication Data

US 2005/0073228 A1    Apr. 7, 2005

(51) Int. Cl.
*H05B 33/00* (2006.01)
*H05B 33/14* (2006.01)
*H01L 51/50* (2006.01)

(52) U.S. Cl. .................... 313/503; 313/501; 313/506; 313/509

(58) Field of Classification Search ........ 313/501–512, 313/110–113
See application file for complete search history.

(56) References Cited

U.S. PATENT DOCUMENTS

| 4,769,292 | A |  | 9/1988 | Tang et al. |
| 4,885,211 | A |  | 12/1989 | Tang et al. |
| 5,405,709 | A |  | 4/1995 | Littman et al. |
| 5,405,710 | A | * | 4/1995 | Dodabalapur et al. ...... 428/690 |
| 5,478,658 | A | * | 12/1995 | Dodabalapur et al. ...... 428/690 |
| 5,683,823 | A |  | 11/1997 | Shi et al. |
| 5,780,174 | A | * | 7/1998 | Tokito et al. ............... 428/690 |
| 5,804,919 | A | * | 9/1998 | Jacobsen et al. ............ 313/506 |
| 5,814,416 | A | * | 9/1998 | Dodabalapur et al. ...... 428/690 |
| 5,847,506 | A | * | 12/1998 | Nakayama et al. ......... 313/504 |
| 6,133,692 | A | * | 10/2000 | Xu et al. .................... 313/506 |
| 6,838,494 | B2 | * | 1/2005 | Chundury et al. .......... 523/135 |
| 2006/0220008 | A1 | * | 10/2006 | Ko ............................. 257/40 |

FOREIGN PATENT DOCUMENTS

| EP | 0 615 401 | 9/1993 |
| EP | 0 801 429 | 10/1997 |
| EP | 1 439 589 | 7/2004 |
| EP | 1 443 572 | 8/2004 |
| EP | 1 450 419 | 8/2004 |
| JP | 07-142169 | 11/1993 |

OTHER PUBLICATIONS

Kido et al., Science, vol. 267, p. 1332 (1995).
Kido et al., Applied Physics Letters, vol. 64, p. 815 (1994).
Deshpande et al., Applied Physics Letters, vol. 75, p. 888 (1999).

* cited by examiner

*Primary Examiner*—Mariceli Santiago
(74) *Attorney, Agent, or Firm*—Raymond L. Owens

(57) ABSTRACT

A white light emitting OLED apparatus includes a microcavity OLED device and a light-integrating element, wherein the microcavity OLED device has a white light emitting organic EL element and the microcavity OLED device is configured to have angular-dependent narrow-band emission, and the light-integrating element integrates the angular-dependent narrow-band emission from different angles from the microcavity OLED device to form white light emission.

29 Claims, 7 Drawing Sheets

WHITE-EMITTING MICROCAVITY OLED DEVICE

CROSS REFERENCE TO RELATED APPLICATIONS

Reference is made to commonly assigned U.S. patent application Ser. Nos. 10/346,424 filed Jan. 17, 2003 entitled "Microcavity OLED Devices" by Yuan-Sheng Tyan et al.; Ser. No. 10/368,513 filed Feb. 18, 2003 entitled "Tuned Microcavity Color OLED Display" by Yuan-Sheng Tyan et al.; Ser. No. 10/356,271 filed Jan. 31, 2003 entitled "Color OLED Display with Improved Emission" by Yuan-Sheng Tyan et al.; Ser. No. 10/347,013 filed Jan. 17, 2003, entitled "Organic Light emitting Diode (OLED) Display With Improved Light Emission Using Metallic Anode" by Pranab K. Raychaudhuri et al.; Ser. No. 10/213,853 filed Aug. 7, 2002, entitled "OLED Apparatus Including a Series of OLED Devices" by Yuan-Sheng Tyan; and Ser. No. 10/214,035 filed Aug. 7, 2002, entitled "Serially Connecting OLED Devices for Area Illumination" by Ronald S. Cok et al., the disclosures of which are incorporated herein by reference.

FIELD OF THE INVENTION

The present invention relates to organic electroluminescent (EL) apparatus. More specifically, this intention relates to a white emitting EL apparatus with improved efficiency.

BACKGROUND OF THE INVENTION

Organic light emitting diode (OLED) devices are attractive because of their low driving voltage, high luminance, wide-angle viewing, and capability for full-color flat emission displays. Tang et al. described a multilayer OLED device in their U.S. Pat. Nos. 4,769,292 and 4,885,211.

Efficient white light producing OLED devices are considered low cost alternatives for several applications such as paper-thin light sources, backlights in LCD displays, automotive dome lights, and office lighting. White light producing OLED devices should be bright, efficient, and generally have a broad emission spectrum that covers most of the visible wavelength range. Herein the term "white" or "substantially white" will be used broadly to mean light that is perceived as white or off-white.

The following patents and publications disclose the preparation of organic OLED devices capable of emitting white light, comprising a hole-transporting layer and an organic luminescent layer interposed between a pair of electrodes.

White light producing OLED devices have been reported before by J. Shi in U.S. Pat. No. 5,683,823 wherein the luminescent layer includes red and blue light emitting materials uniformly dispersed in a host emitting material. This device has good electroluminescent characteristics, but the concentrations of the red and blue dopants are very small, such as 0.12% and 0.25% of the host material. These concentrations are difficult to control during large-scale manufacturing. Sato et al. in JP 07,142,169 discloses an OLED device capable of emitting white light, made by forming a blue light emitting layer next to the hole-transporting layer and followed by a green light emitting layer having a region containing a red fluorescent layer.

Kido et al., in Science, Vol. 267, p. 1332 (1995) and in Applied Physics Letters, Vol. 64, p. 815 (1994), report a white light producing OLED device. In this device, three emitter layers with different carrier transport properties, each emitting blue, green, or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. Deshpande et al., in Applied Physics Letters, Vol. 75, p. 888 (1999), describe a white OLED device using red, blue, and green luminescent layers separated by a hole blocking layer.

OLED devices typically have at least one transparent electrode, which is often fabricated from a conductive oxide such as indium-tin oxide (ITO). Such materials have sufficient conductivity for displays, in which the individual pixels are on the order of 1 mm or less. However, the conductivity of such transparent electrodes can be insufficient for applications with much larger individual emitting units, such as panel lighting. This disadvantage can be overcome by making the emitting elements in narrow stripes, but registration difficulties would make such a device more difficult to fabricate, increasing the manufacturing cost. Furthermore, such transparent electrodes are themselves costly and add to the manufacturing cost.

SUMMARY OF THE INVENTION

It is therefore an object of the present invention to provide a white OLED apparatus with high illumination efficiency.

This object is achieved by a white light emitting OLED apparatus comprising a microcavity OLED device and a light-integrating element, wherein the microcavity OLED device has a white light emitting organic EL element and the microcavity OLED device is configured to have angular-dependent narrow-band emission, and the light-integrating element integrates the angular-dependent narrow-band emission from different angles from the microcavity OLED device to form white light emission.

ADVANTAGES

The present invention provides a white light emitting OLED apparatus that utilizes an OLED device having only metal electrodes for reduced cost, higher conductivity, and improved ease of manufacturing. The OLED apparatus provides improved performance.

Figure 1:
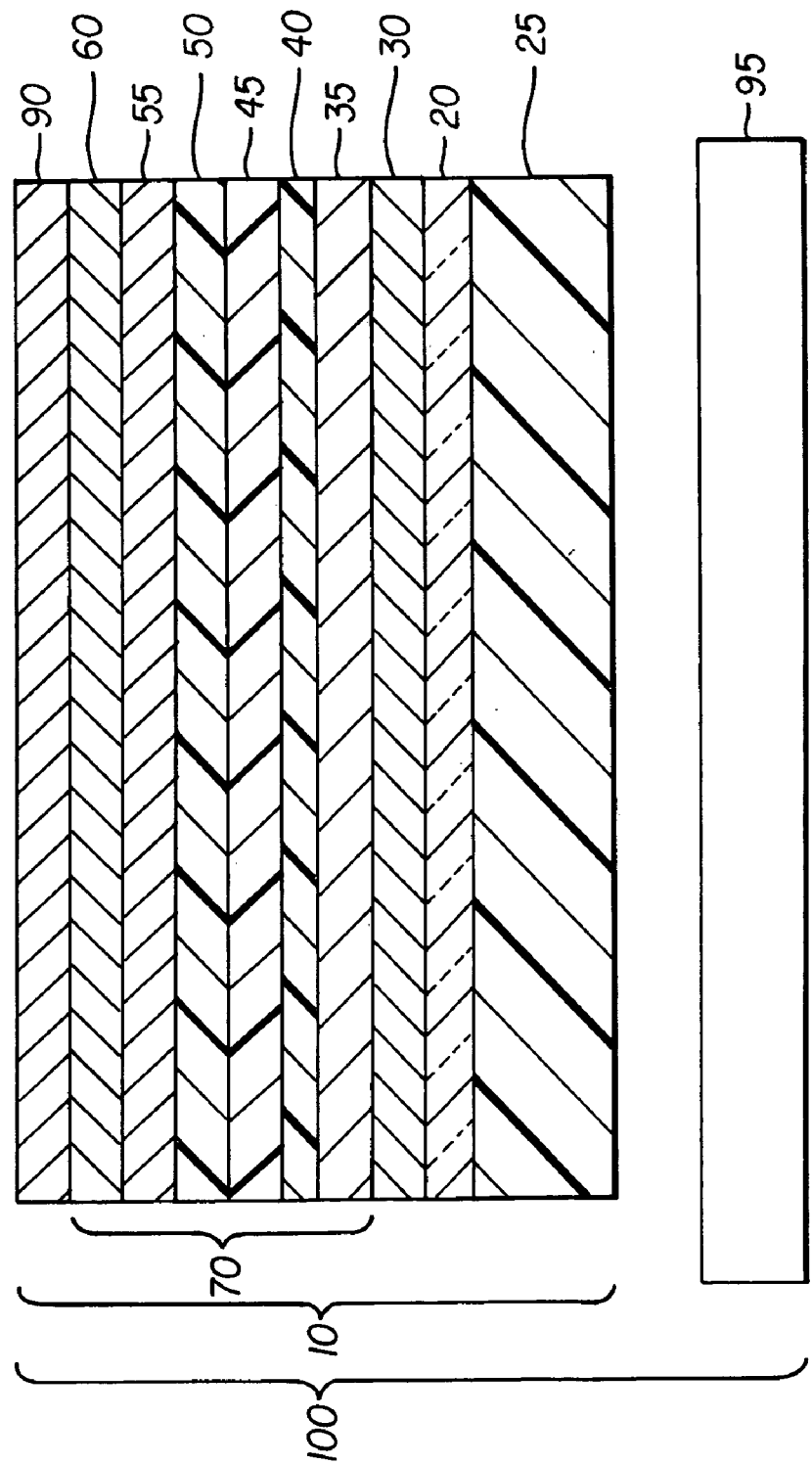
FIG. 1 is a cross-sectional view of a white light emitting OLED apparatus according to a first embodiment of this invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a light emitting device comprising organic light emitting diodes. The term "OLED apparatus" is used to describe an apparatus that includes an OLED device as one of its key components. The term "white light" is used for a light that has a broad emission spectrum that covers most of the visible wavelengths and that is generally perceived by a user to have white color. The term "microcavity OLED device" is used to designate an OLED device that comprises an organic EL element disposed between two reflecting mirrors having over 30% reflectivity. In most cases, one of the reflecting mirrors is essentially opaque and the other one is semitransparent having an optical density less than 1.0. The two reflecting mirrors form a Fabry-Perot microcavity that strongly affects the emission characteristics of the OLED device. Emission near the wavelength corresponding to the resonance wavelength of the cavity is enhanced and those with other wavelengths are suppressed. The net result is a significant narrowing of the bandwidth of the emitted light and a significant enhancement of its intensity. The emission spectrum is also highly angular dependent. The term "organic EL element" refers to the one or more organic layers disposed between the two electrodes of an OLED device that emits light under applied voltage during the operation of the OLED device. For the purpose of this application, "organic EL element" can also include inorganic electron or hole-injecting layers if such layers are used in the OLED device.

For large area white light emitting OLED devices, the problems associated with the use of transparent conductive oxide electrodes, namely the high cost and the low electrical conductivity, can be overcome by using a thin metal electrode in place of the oxide electrode. However, when a metal film of sufficient electrical conductance is used, it is also rather reflective. As a result, a microcavity structure is formed because in general the other electrode is also metallic and reflective. The microcavity structure significantly narrows the bandwidth of the emitted light. Even when a white light emitting organic EL element is used in the device, the output from the OLED device becomes narrow-banded. It is no longer useful as a white light emitting OLED device.

The present invention recognizes the problem and also recognizes that the emission from a microcavity OLED device is highly angle dependent. The resonance condition of a microcavity OLED device can be described by Eq. 1:

$$2\Sigma n_i L_i \cos \theta_i + (Q_{m1} + Q_{m2})\lambda/2\pi = m\lambda \qquad \text{Eq. 1}$$

wherein:

$n_i$ is the refractive index and $L_i$ is the thickness of the ith sublayer in organic EL element;

$\theta_i$ is the angle of the light in the ith sublayer measured from the normal to the plane of the OLED device;

$Q_{m1}$ and $Q_{m2}$ are the phase shifts in radians at the two organic EL element-metal electrode interfaces, respectively;

$\lambda$ is the resonant wavelength to be emitted from the device; and m is a non-negative integer.

Note that the $\theta_i$ for the different sublayers (and including the angle of the light emitted outside of the device) are not independent but are related to each other via Snell's Law: $n_i \sin \theta_i = n_j \sin \theta j$.

Eq. 1 shows that the resonant emission wavelength $\lambda$ from the microcavity is a function of angle. With increasing angle the resonant emission wavelength becomes shorter. In fact, the change in emission wavelength can be large enough that over the zero to 90 degree angle range the emission wavelength can cover most of the visible wavelength.

Thus, in accordance with the present invention, a white OLED apparatus is constructed by adding a light-integrating element to a microcavity OLED device to integrate the narrow-band emitted light from the microcavity OLED device at various angles into a single broadband emission with reduced angular dependence that can be perceived as white light. Optical modeling simulations carried out by the present invention suggests that the integrated emission can essentially reproduce the shape of the emission spectrum from the organic EL element in a non-microcavity device over the wavelength region that the white OLED apparatus covers. Moreover, when the microcavity OLED device is properly designed, the integrated total output can improve over a non-microcavity OLED device using the same organic EL element. To cover the visible spectrum, the organic EL element is selected to emit white light.

The present invention further recognizes, by surprise, important implications of the fact that the angle $\theta_i$ in Eq. 1 actually refers to the internal angle inside the microcavity. The angle in the air, $\theta_{air}$, is larger because the refractive index of materials in the OLED structure is larger than that of the air. There is a critical internal angle, $\theta_c$, above which light emitted from the microcavity is trapped because of total internal reflection. Although light trapping due to total internal reflection has been well documented for conventional, non-microcavity OLED devices, some important implications of such light trapping in microcavity OLED devices have never been recognized.

The present invention discovers that, for example, for a bottom-emitting OLED device with light emitting through the substrate, there can be a substantial amount of light trapped completely in the substrate. Similarly, for a top-emitting OLED device with a dielectric layer disposed over the semitransparent top electrode, a substantial amount of light can be trapped in the dielectric layer. Because in a microcavity OLED device the emission spectrum changes with angle and with increasing angle the emission wavelength generally becomes shorter, the trapped light has shorter wavelength than the light emitted from the microcavity OLED device into the air. For a microcavity OLED tuned to higher order short wavelength emission (m>0 in Eq. 1), however, a lower order cavity resonance can move from the infrared into the visible region with increasing angle. This longer wavelength emission will then tend to be trapped in the device. In comparison, in a conventional, non-microcavity OLED device, there is a much smaller spectral difference between the trapped light and the emitted light. For example, for a microcavity OLED device tuned to emit in the red wavelength region, with increasing angle the emitted light can change from red to orange to yellow. A substantial amount of green and blue light can be trapped inside the substrate or the high index-of-refraction dielectric layers. The present invention discovers that this trapped light can be de-trapped from the substrate or the dielectric layers by using a total-internal-reflection-frustrater (TIRF). There are many ways to provide a TIRF, which will be discussed in the latter part of the present application. In a preferred embodiment of the present invention, a TIRF in the form of a light scattering film is optically coupled to the outside surface of the substrate of a bottom-emitting OLED device. When the trapped light reaches the light scattering film, a fraction of it changes angle of propagation and therefore become de-trapped. The remaining trapped light propagates in the substrate and can be de-trapped later when it reaches the light scattering film again. This de-trapped light adds to the emission from the OLED device and increases its luminous output. Because the trapped light includes light with shorter wavelengths, the de-trapping also increases the bandwidth of the emitted light and is hence highly desirable for a white OLED apparatus. The model simulation performed by the present invention suggests that for improved emission efficiency, the microcavity OLED device is preferred to have a resonance emission wavelength in the normal direction in the red region of the visible spectrum, preferably above 600 nm. Alternatively, the microcavity OLED device can be tuned to a higher order (m>0 in Eq. 1) resonance in the blue region with wavelength less than 500 nm. In this case, the trapped light (from a resonance with a smaller value of m) will be in the red region of the wavelength range, and by de-trapping this light the emission is again enhanced and the emission wavelength is again broadened.

In another preferred embodiment of the present invention, the TIRF is placed between the substrate or the dielectric layers and the semitransparent metallic electrode of the OLED device. By having the TIRF close to the semitransparent metal electrode, it becomes possible to de-trap the light in the organic layers as well, further improving the output efficiency and the spectral bandwidth of the OLED device.

Any structure that is effective in randomly changing the direction of light can be used to integrate the emitted light over angles. Ways known to the art include light scattering layers containing surface or bulk scattering features. Such layers are well known in the art and can be used to effectively change the direction of light passing through them. For example, a light-integrating element can comprise a layer or coating having inclusions dispersed in a matrix wherein the refractive indexes of the inclusions are different from those of the matrix. An example of this is a plastic film or coating loaded with one or more white pigments such as $TiO_2$. The light-integrating element can also comprise a plastic film or coating having crystalline and amorphous regions having different refractive indexes. Examples of such plastics include high density polyethylene, low density polyethylene, ETFE, polystyrene, and polypropylene. The light-integrating element can comprise a surface light scattering structure or lens. A scattering layer can also be used in a reflective mode causing the light reflected from the surface to change direction and be effectively integrated to form uniform illumination. The light-integrating element can be located apart from the OLED device, although it can also be incorporated on or in the device and, in the most preferred case, it can be a single layer serving the functions of both light-integrating element and TIRF. For example, in this preferred case, the white light emitting apparatus can be constructed of a bottom-emitting OLED device having a light scattering element disposed over the outside surface of the substrate, wherein the light scattering element is designed to function both as TIRF and the light integrator. In alternative embodiments of the invention, the layer serving as both light-integrating element and TIRF can be disposed close to the semitransparent electrode.

The TIRF can also comprise a light scattering element. For example, it can comprise a layer or coating having inclusions dispersed in a matrix wherein the refractive indexes of the inclusions are different from those of the matrix. A specific example of a TIRF can be a plastic film or coating loaded with one or more white pigments such as $TiO_2$. The TIRF can also comprise a plastic film or coating having crystalline and amorphous regions having different refractive indexes. Examples of such plastics include high density polyethylene, low density polyethylene, ETFE, polystyrene, and polypropylene. The TIRF can comprise a surface light scattering structure or lens elements.

In another alternative embodiment of the present invention, the microcavity OLED device is divided into two or more sub-regions each tuned to a different emission wavelength in the normal direction. This is to ensure that the emission from the white OLED apparatus can cover the entire visible wavelength range. For example, one of the regions can be tuned to emit a red or infrared light in the normal direction. The emission at higher angles from this region can cover yellow and green region of the wavelength. A second region can be tuned to emit green light in the normal direction, and the higher angle emission from the device can cover the blue wavelength region. By using two or more regions, the entire visible wavelength range can be effectively covered, and the integrated total output can be improved over a non-microcavity OLED device using the same organic EL element. To improve wavelength coverage, one of the sub-regions is preferably tuned to emit red light with a peak wavelength at normal angle larger than 550 nm. At least one of the other regions is tuned to emit light with a peak wavelength at normal angle smaller than 550 nm. Furthermore, a TIRF can be added to improve the light emission efficiency and to broaden the spectral output of the OLED device.

For many applications that require a generally uniform white emission from the device, the size of the individual regions can be kept small. The different regions can be interdispersed so that after integration by the light-integrating element, the emission from the white OLED apparatus appears uniform.

For the different regions that are tuned to emit different colored light in the normal direction, a common white emitting organic EL element can still be used or, alternatively, emitting materials with different intrinsic emission spectra can be used in the different regions. The different tuning can be achieved by varying the spacing between the two reflecting electrodes by, for example, varying the total thickness of the organic layers. Alternatively, a transparent conductive phase layer can be used between the organic layers and one of the reflecting electrodes to adjust the spacing between the two reflecting electrodes.

Turning now to FIG. 1, there is shown a cross-sectional view of a white microcavity OLED apparatus 100 according to a first embodiment of the present invention. The white OLED apparatus includes an OLED device 10 and a light-integrating element 95. The OLED device 10 includes at a minimum a substrate 20, a bottom electrode 30, commonly configured to be an anode, a top electrode 90, commonly configured as a cathode, spaced from bottom electrode 30, and a light emitting layer 50. The OLED device can also include one or more of a TIRF such as TIRF 25, a transparent conductive spacer layer 35, a hole-injecting layer 40, a hole-transporting layer 45, an electron-transporting layer 55, and an electron-injecting layer 60. As will be seen, hole-injecting layer 40, hole-transporting layer 45, light emitting layer 50, electron-transporting layer 55, and electron-injecting layer 60 comprise organic EL element 70. These components will be described in more detail.

Substrate 20 can be an organic solid, an inorganic solid, or a combination of organic and inorganic solids. Substrate 20 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 20 can be a homogeneous mixture of materials, a composite of materials, or multiple layers of materials. Substrate 20 can be an OLED substrate, that is a substrate commonly used for preparing OLED devices, e.g. active-matrix low-temperature polysilicon or amorphous-silicon TFT substrate. The substrate 20 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

Figure 2:
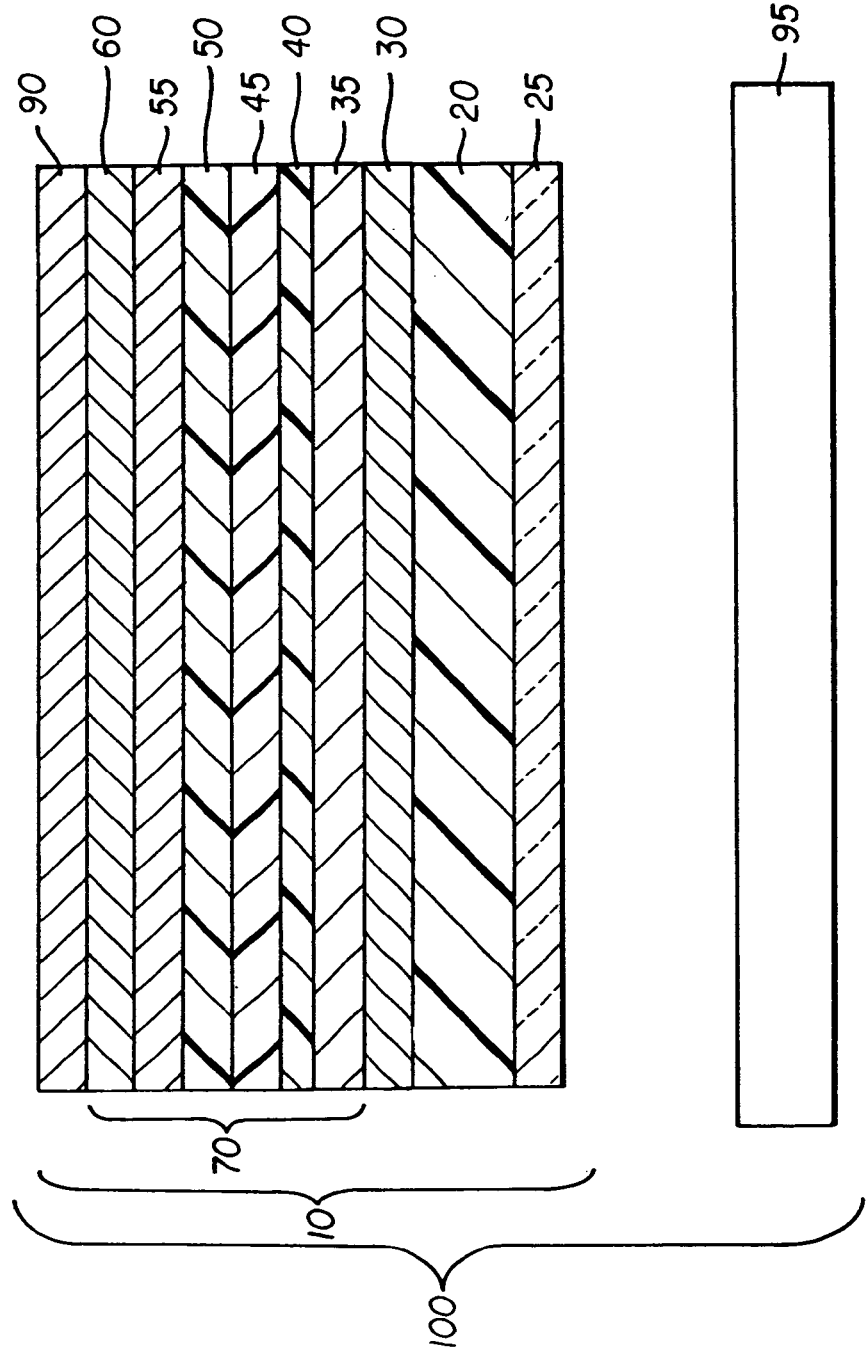
FIG. 2 is a cross-sectional view of a white light emitting OLED apparatus according to another embodiment of this invention.

TIRF 25 is a structure that is designed to de-trap light emitted by organic EL element 70 and trapped in the OLED device 10. TIRF 25 can be, e.g., a light scattering element that scatters light. In this case, it can be a volume light scattering element including particles or voids dispersed in a matrix having different refractive indices from the particles or voids. Many common polymers that contain crystalline phases and appear white in color or being translucent can be good volume scattering elements and can be used effectively as TIRF. Polymers can also be loaded with whitening agents such as $TiO_2$ and be used effectively as TIRF. TIRF can also be a surface light scattering element including surface features or textures that scatter light. It can be a separate element attached and optically coupled to substrate 20, or it can be an integrated part of the substrate. For OLED device 10 that emits through substrate 20 and metallic bottom electrode 30 is semitransparent, TIRF 25 can be disposed, as shown in FIG. 1, on the outside surface of substrate 20; or it can be disposed, as shown in FIG. 2, between substrate 20 and metallic bottom electrode 30. For OLED device 10 having semitransparent top electrode 90 and emitting through top electrode 90, TIRF 25 can be disposed over semitransparent top electrode 90. In some cases, a transparent dielectric film, not shown in the figures, can be disposed between TIRF 25 and semitransparent top electrode 90.

A metallic bottom electrode 30 is formed over substrate 20 and is most commonly configured as an anode. Bottom electrode 30 is also a reflective mirror. When EL emission is viewed through the substrate 20, bottom electrode 30 should be made of a reflective metal and should be thin enough so that it has a finite partial transmittance at the wavelength of the emitted light, referred to as being semitransparent. For practical devices, bottom electrode 30 should have a reflectance of at least 30% and an optical density of less than 1.0, measured as a single film over a transparent substrate of common glass or plastic. Only a small number of metals, including Ag or Au, and alloys thereof, defined as alloys having at least 50 atomic percent of at least one of these metals, are preferably used as bottom electrode 30. The thickness range of bottom electrode 30 is limited and is selected to optimize the luminance light output at a predetermined wavelength from OLED device 10. In certain circumstances, it is possible to also include a transparent conductive oxide layer in combination with the thin reflective metal layer in bottom electrode 30. Since lateral conductance is provided by the thin reflective metal layer, the conductivity of the transparent conductive oxide layer does not have to be high. Suitable materials include indium oxide ($InO_x$), tin oxide ($SnO_x$), zinc oxide ($ZnO_x$), molybdenum oxide ($MoO_x$), vanadium oxide ($VO_x$), antimony oxide ($SbO_x$), or mixtures thereof.

When EL emission is viewed through top electrode 90, bottom electrode 30 is preferably a reflective metal with a thickness that gives an optical density of 1.5 or higher so that it is essentially opaque and a fully reflective mirror. The emission efficiency of the OLED device increases with increasing reflectivity of bottom electrode 30. Bottom electrode 30 is preferably selected from a list including Ag or Au, Al, Mg, or Ca, or alloys thereof.

While not always necessary, it is often useful that a hole-injecting layer 40 be formed over bottom electrode 30 in an organic light emitting display. The hole-injecting material can serve to improve the film formation property of subsequent organic layers and to facilitate injection of holes into the hole-transporting layer. Suitable materials for use in hole-injecting layer 40 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide ($VO_x$), molybdenum oxide ($MoO_x$), nickel oxide ($NiO_x$), etc. Alternative hole-injecting materials reportedly useful in organic EL devices are described in EP 0 891 121 A1 and EP 1 029 909 A1.

While not always necessary, it is often useful that a hole-transporting layer 45 be formed and disposed between bottom electrode 30 and top electrode 90. Desired hole-transporting materials can be deposited by any suitable way such as evaporation, sputtering, chemical vapor deposition, electrochemical means, thermal transfer, or laser thermal transfer from a donor material. Hole-transporting materials useful in hole-transporting layer 45 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A:

A

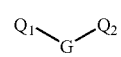

wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B:

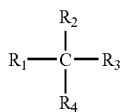

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C:

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D:

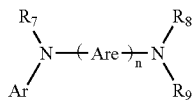

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light emitting layer 50 produces light in response to hole-electron recombination. Light emitting layer 50 is disposed between the reflective mirrors that are bottom electrode 30 and top electrode 90, and over any other layers formed, such as hole-transporting layer 45. Desired organic light emitting materials can be deposited by any suitable way such as evaporation, sputtering, chemical vapor deposition, electrochemical means, or radiation thermal transfer from a donor material. Useful organic light emitting materials are well known. As more fully described in U.S. Pat. Nos. 4,769,292 and 5,935,721, the light emitting layers of the organic EL element comprise a luminescent or fluorescent material where electroluminescence is produced as a result of electron-hole pair recombination in this region. The light emitting layers can be comprised of a single material, but more commonly include a host material doped with a guest compound or dopant where light emission comes primarily from the dopant. The dopant is selected to produce color light having a particular spectrum. The host materials in the light emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red:

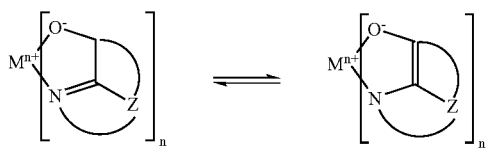

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:
CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)].

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red:

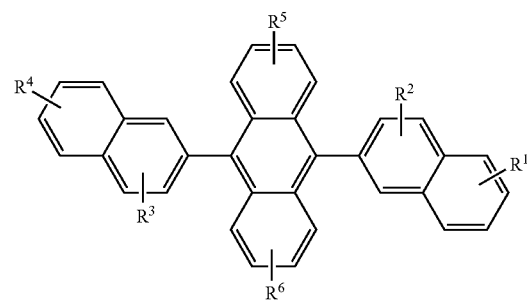

F wherein $R^1$, $R^2$, $R^3$, $R^4$, $R^5$, and $R^6$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red:

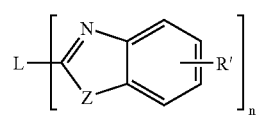

G where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2, 2', 2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

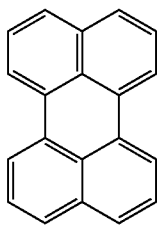

L1

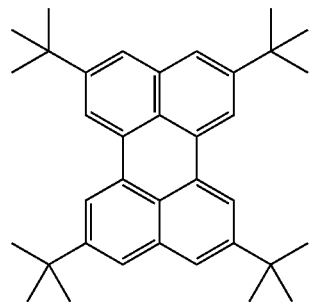

L2

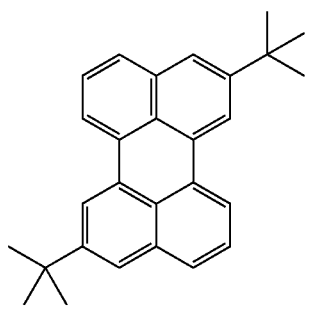

L3

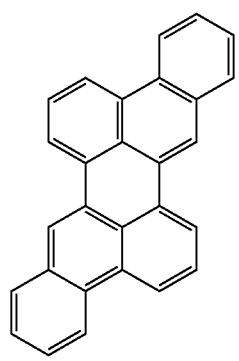

L4

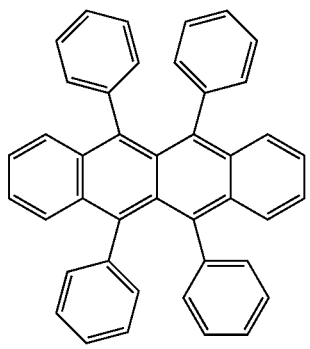

L5

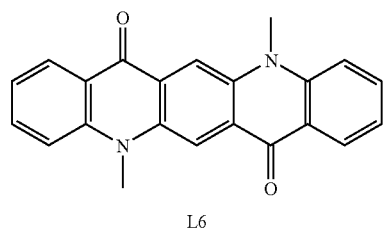

L6

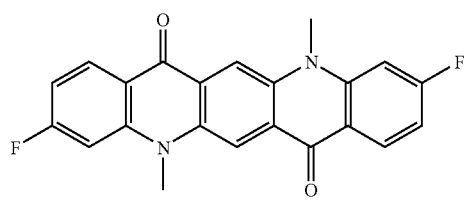

L7

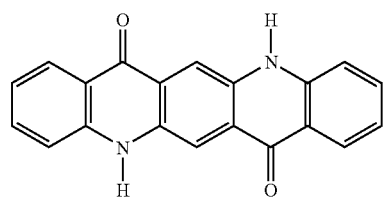

L8

-continued

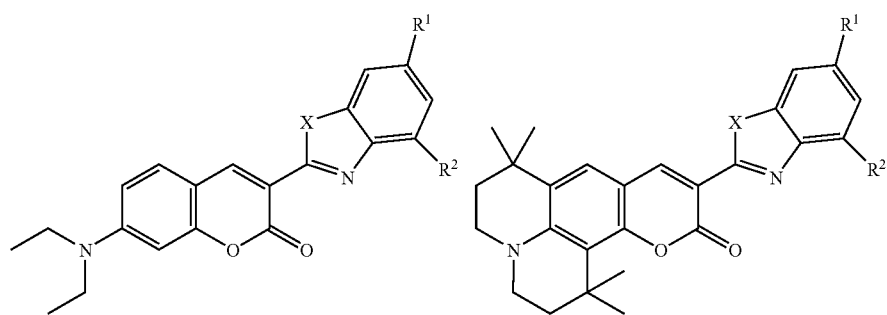

|     | X | R1     | R2     |     | X | R1     | R2     |
|-----|---|--------|--------|-----|---|--------|--------|
| L9  | O | H      | H      | L23 | O | H      | H      |
| L10 | O | H      | Methyl | L24 | O | H      | Methyl |
| L11 | O | Methyl | H      | L25 | O | Methyl | H      |
| L12 | O | Methyl | Methyl | L26 | O | Methyl | Methyl |
| L13 | O | H      | t-butyl| L27 | O | H      | t-butyl|
| L14 | O | t-butyl| H      | L28 | O | t-butyl| H      |
| L15 | O | t-butyl| t-butyl| L29 | O | t-butyl| t-butyl|
| L16 | S | H      | H      | L30 | S | H      | H      |
| L17 | S | H      | Methyl | L31 | S | H      | Methyl |
| L18 | S | Methyl | H      | L32 | S | Methyl | H      |
| L19 | S | Methyl | Methyl | L33 | S | Methyl | Methyl |
| L20 | S | H      | t-butyl| L34 | S | H      | t-butyl|
| L21 | S | t-butyl| H      | L35 | S | t-butyl| H      |
| L22 | S | t-butyl| t-butyl| L36 | S | t-butyl| t-butyl|

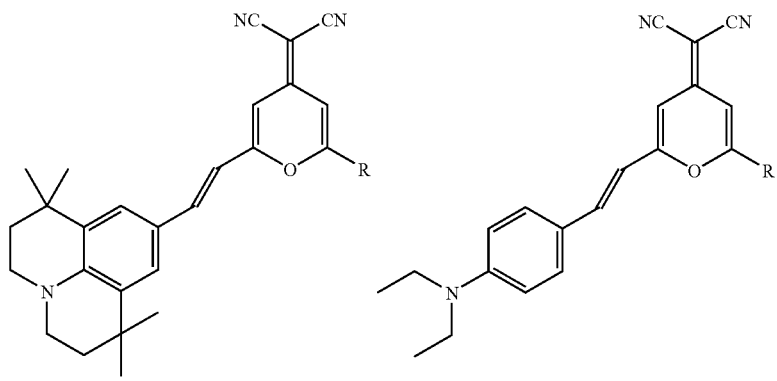

|     | R       |     | R       |
|-----|---------|-----|---------|
| L37 | phenyl  | L41 | phenyl  |
| L38 | methyl  | L42 | methyl  |
| L39 | t-butyl | L43 | t-butyl |
| L40 | mesityl | L44 | mesityl |

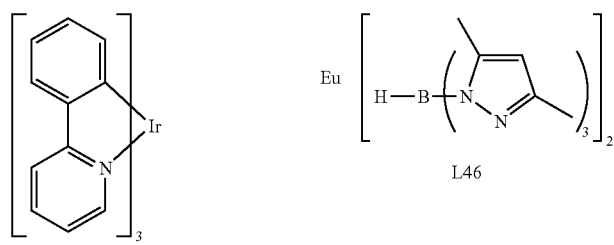

L45        L46

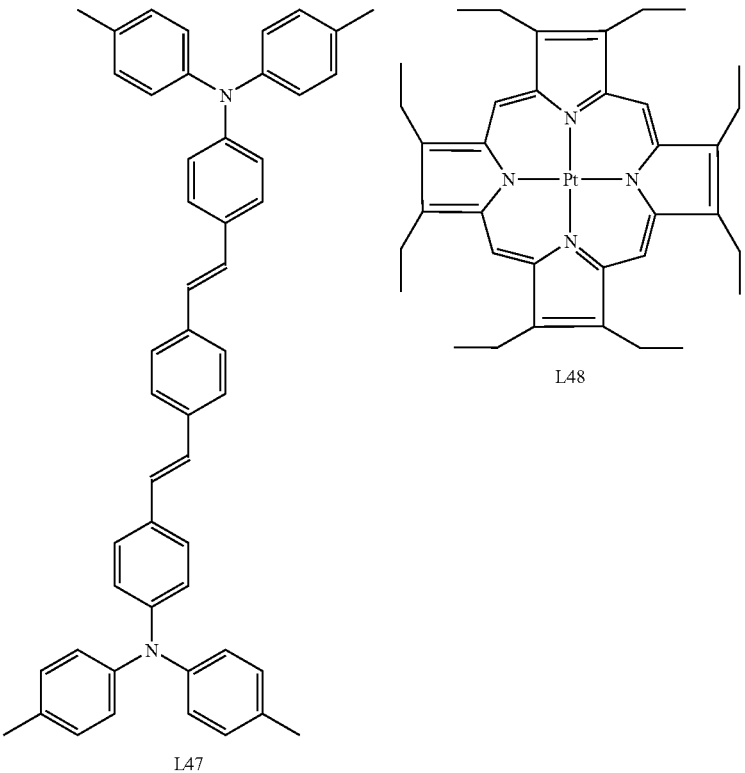

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

Although not shown, the device can additionally comprise two or more emissive layers, if such is desired for proper emissive properties of the resulting OLED device.

While not always necessary, it is often useful that OLED device 10 includes an electron-transporting layer 55 formed over light emitting layer 50. Desired electron-transporting materials can be deposited by any suitable way such as evaporation, sputtering, chemical vapor deposition, electrochemical means, thermal transfer, or laser thermal transfer from a donor material. Preferred electron-transporting materials for use in electron-transporting layer 55 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

It will be understood that, as is common in the art, some of the layers described above can have more than one function. For example, light emitting layer 50 can have hole-transporting properties or electron-transporting properties as desired for performance of the OLED device. Hole-transporting layer 45 or electron-transporting layer 55, or both, can have emitting properties. In such a case, fewer layers can be sufficient for the desired emissive properties.

There are numerous configurations of the organic EL media layers wherein the present invention can be successfully practiced. Examples of organic EL media layers that emit white light are described, for example, in EP 1 187 235; U.S. Patent Application Publication 2002/0025419 A1; EP 1 182 244, U.S. Pat. Nos. 5,683,823; 5,503,910; 5,405,709; and 5,283,182. As shown in EP 1 187 235 A2, a white light emitting organic EL media with a substantially continuous spectrum in the visible region of the spectrum can be achieved by the inclusion of the following layers:

a hole-injecting layer 40 disposed over the anode;
a hole-transporting layer 45 that is disposed over the hole-injecting layer 40 and is doped with a rubrene compound for emitting light in the yellow region of the spectrum;
a light emitting layer 50 doped with a blue light emitting compound disposed over the hole-transporting layer 45; and
an electron-transporting layer 55.

The organic EL media materials mentioned above are suitably deposited through a vapor-phase method such as sublimation, but can be deposited from a fluid, for example, from a solvent with an optional binder to improve film formation. If the material is a polymer, solvent deposition is useful, but other methods can be used, such as sputtering or thermal transfer from a donor sheet. The material to be deposited by sublimation can be vaporized from a sublimator "boat" often comprised of a tantalum material, e.g. as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet.

An electron-injecting layer 60 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Top electrode 90 is formed over the electron-transporting layer 55 or over light emitting layers 50 if an electron-transporting layer is not used. Top electrode 90 is also a reflective mirror. When light emission is through the bottom electrode 30, the top electrode 90 material is preferably a reflective metal with a thickness that gives an optical density of 1.5 or higher so that it is essentially opaque and reflective. The emission efficiency of the OLED device increases with increasing reflectivity of top electrode 90. Top electrode 90 is preferably selected from a list including Ag, Au, Al, Mg, or Ca, or alloys thereof.

When light emission is viewed through top electrode 90, it needs to include a reflective metal that is thin enough such that it is semitransparent to the emitted light. It is preferably selected from a list including Ag or Au, or alloys thereof. The thickness range of top electrode 90 is limited and is selected to optimize the luminance light output at a predetermined wavelength from OLED device 10, as will be further described. In certain circumstances, it is possible to also include a transparent conductive oxide layer in combination with the thin reflective metal layer in top electrode 90. Since lateral conductance is provided by the thin reflective metal layer, the conductivity of the transparent conductive oxide layer does not have to be high. Suitable materials include indium oxide ($InO_x$), tin oxide ($SnO_x$), zinc oxide ($ZnO_x$), molybdenum oxide ($MoO_x$), vanadium oxide($VO_x$), antimony oxide ($SbO_x$), or mixtures thereof.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Turning now to FIG. 2, there is shown a cross-sectional view of an OLED device according to another embodiment of this invention. This embodiment is similar to the previous embodiment, except that TIRF 25 is disposed over substrate 20 and under bottom electrode 30.

Figure 3:
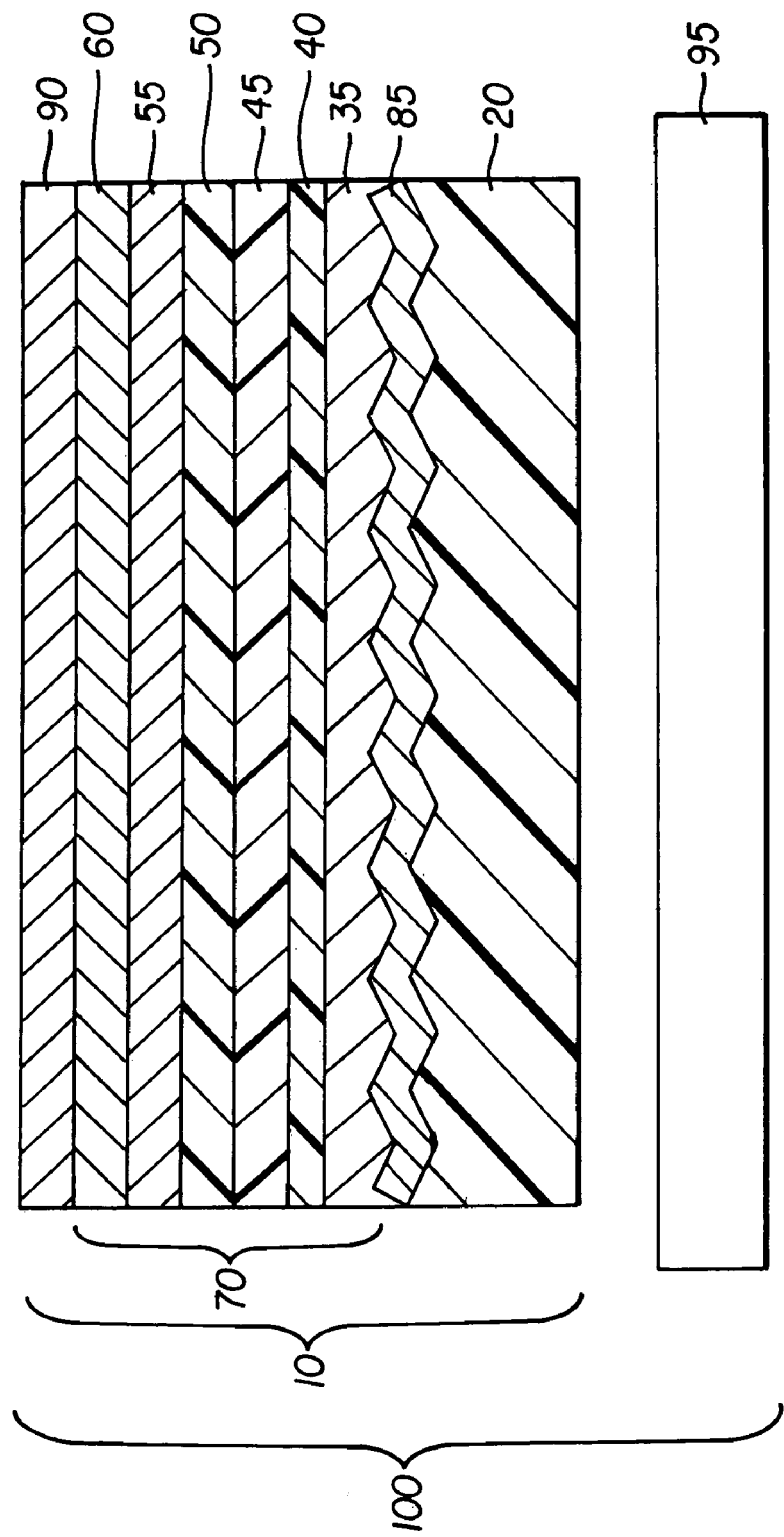
FIG. 3 is a cross-sectional view of a white light emitting OLED apparatus according to yet another embodiment of this invention.

Turning now to FIG. 3, there is shown a cross-sectional view of white light emitting OLED apparatus according to a third embodiment of this invention. In this embodiment, there is no discrete TIRF layer. Bottom electrode 85 formed on a contoured surface of substrate 20 functions as the TIRF to scatter and de-trap the emitted light from organic EL element 70.

Figure 4:
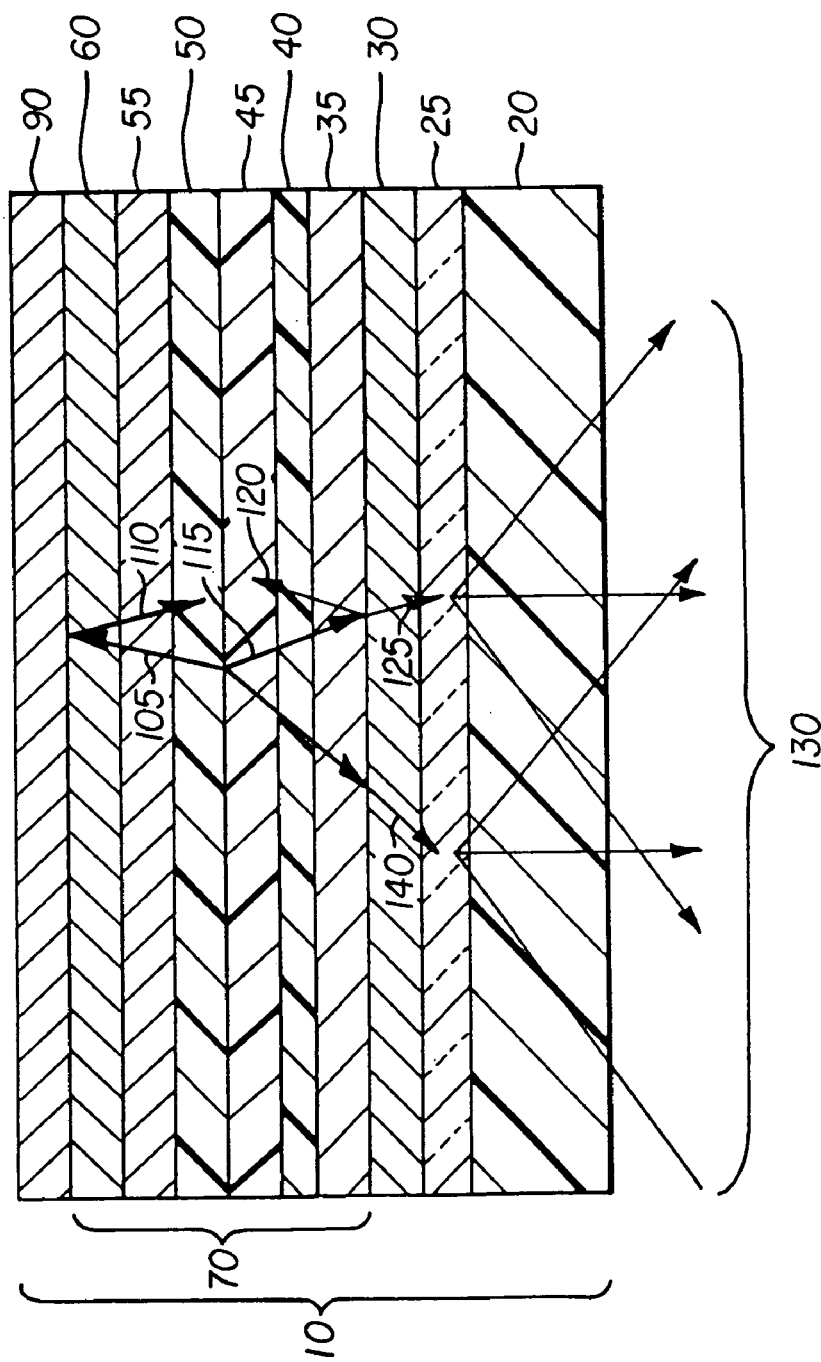
FIG. 4 is a cross-sectional view of a microcavity OLED device according to this invention showing schematically the effect of light transmission in such a device.

FIG. 4 is a cross-sectional view of above OLED device 10 schematically showing the effect of light emission in a microcavity. Microcavity OLED devices have been reported in the prior art to achieve improved chromaticity and emission efficiency. Although OLED device 10 is shown as emitting light from the bottom (that is, a bottom-emitting device), it will be understood that in some embodiments OLED device 10 can be a top-emitting device.

In accordance with the present invention, the thickness of the organic EL element 70 can be varied in order to adjust the microcavity resonance wavelength. A transparent conductive spacer layer 35 can be used as an additional ways to adjust the microcavity resonance wavelength. Transparent conductive spacer layer 35 can be disposed between one of the metallic electrodes and light emitting layer 50. It needs to be transparent to the emitted light and it needs to be conductive to carry the charge between the metallic electrode and the light emitting layer 50. Since only through-film conductance is important, a bulk resistivity of less than about $10^8$ ohm-cm is adequate. Many metal oxides such as, but not limited to, indium-tin oxide ($ITO_x$), zinc-tin oxide ($ZTO_x$), tin-oxide ($SnO_x$), indium oxide ($InO_x$), molybdnum oxide ($MoO_x$), tellurium oxide ($TeO_x$), antimony oxide ($SbO_x$), and zinc oxide ($ZnO_x$), can be used.

In this embodiment, light is shown as being emitted at the interface of hole-transporting layer 45 and light emitting layer 50. Light 105 is emitted in the direction of reflective top electrode 90 and is reflected as reflected light 110. Light 115 is emitted in the direction of semitransparent bottom electrode 30 and is partially reflected as partially reflected light 120, and partially transmitted as partially transmitted light 125. Partially transmitted light 140 represents light emitted by OLED device 10 in a different direction. Emitted light 130 is the light that actually emitted from OLED device into the air.

Since it is desirable that the absorption of light by the metallic semitransparent reflective bottom electrode 30 be as low as feasible, a useful addition is an absorption-reduction layer between the metallic semitransparent bottom electrode 30 and substrate 20. The purpose of this layer is to reduce the electric field produced by the light wave (and thus the absorption of the light wave) within the semitransparent bottom electrode 30 itself. To a good approximation, this result is best accomplished by having the electric field of the light wave reflected back from the interface between the absorption-reduction layer and the substrate 20 interfere destructively with, and thus partly cancel, the electric field of the light passing out of the device. Elementary optical considerations then imply that this will occur (for an absorption-reduction layer having a higher refractive index than the substrate) when the following equation is approximately satisfied:

$$2n_A L_A + n_T L_T = (m_A + 1/2)\lambda \qquad \text{Eq. 2}$$

where:

$n_A$ and $L_A$ are the refractive index and the thickness of the absorption-reduction layer, respectively;

$n_T$ and $L_T$ are the real part of the refractive index and the thickness of the semitransparent anode respectively; and $m_A$ is a non-negative integer.

It is preferred to have $m_A$ as small as practical, usually 0 and typically less than 2. For an OLED device having light emitted through top electrode 90, the absorption reduction layer is disposed over top electrode 90.

In an alternate configuration of the device, the bottom electrode 30 can be the cathode and the top electrode 90 can be the anode. In such a case, the organic EL element 70 is appropriately oriented so that the hole-injecting and hole-transporting layers are closer to the anode, and the electron-injecting and electron-transporting layers are closer to the cathode.

Figure 5:
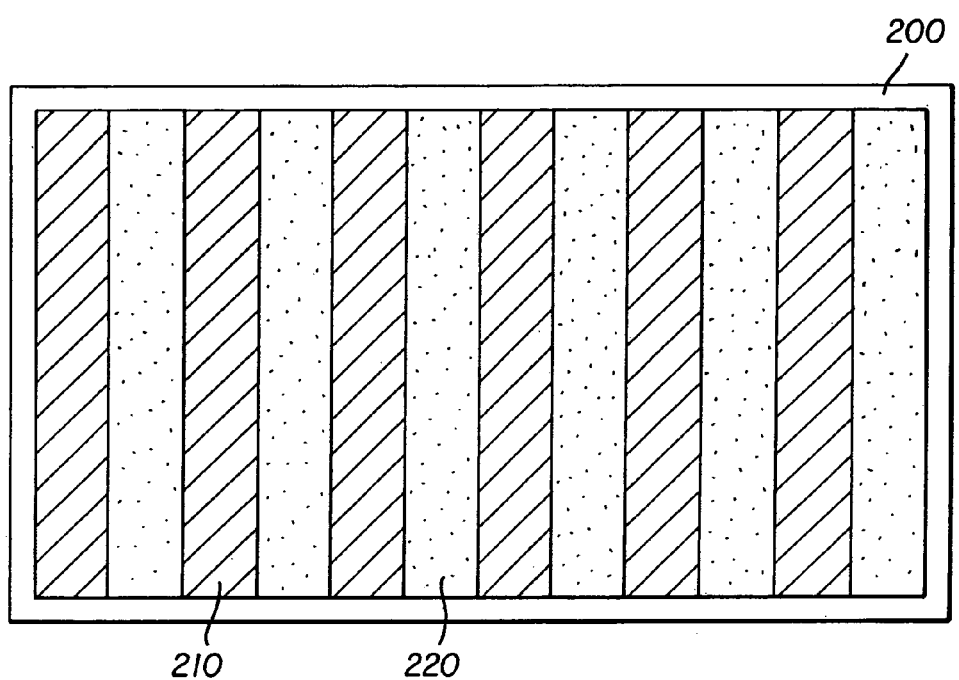
FIG. 5 is a plan view of a microcavity OLED device according to this invention.

To cover the complete visible spectrum, it can be desirable to provide two or more different microcavities with distinct emission spectra. Turning now to FIG. 5, there is shown a plan view of an OLED device according to this invention. OLED device 200 comprises strips of first color emitter 210 and second color emitter 220. First and second color emitters 210 and 220 can be individual OLED devices as described above wherein the microcavity has been tuned for each to give a specific and complementary color. For example, first color emitter 210 can have a microcavity that enhances the emission of red light, while second color emitter 220 can have a microcavity that enhances the emission of green light as described above. For example, one can provide transparent conductive spacer layer 35 for one emitter (e.g. red) while not providing it for the other emitter (e.g. green). Alternately, the thickness of another layer, e.g. hole-transporting layer 45, can be varied to achieve the same effect. If the two emitters are close enough and the light-integrating element is sufficient, the overall emitted light will be perceived as being white. TIRF 25 can further be used to improve the luminous output and the spectral range of the white OLED apparatus.

It will be understood by those skilled in the art that there are many ways to achieve a white emitting organic EL element. One that is of particular interest to large area illumination applications is to use a stacked OLED architecture. A stacked OLED has been described in the prior art in U.S. Pat. Nos. 6,107,734; 6,337,492; and 6,274,980. It comprises two or more OLED units vertically stacked together. Each OLED unit has its own organic EL element, and between a pair of OLED units there is a connecting element that supplies electrons to the electron-transporting layer (ETL) of one device and holes to the hole-transporting layer (HTL) of the other device in the pair. All the units could be designed to emit the same white light spectrum or, alternatively, they can each be designed to emit a part of the visible spectrum, and in combination they produce white emission. For example, one of the units could be designed to emit red light and another on to emit green light so that in a non-microcavity device the stacked OLED device emits white light in combination. In accordance with the present invention, a stacked OLED device is constructed to have a microcavity structure having two reflecting metal electrodes. The microcavity stacked OLED device emits narrow-band light with angular dependence. This microcavity stacked OLED device is then combined with a light-integrating element and, optionally, a TIRF to achieve a white OLED apparatus.

It will be understood that other device structures such as a monolithically integrated serial connection structure as disclosed in commonly assigned U.S. patent application Ser. No. 10/213,853 filed Aug. 7, 2002, entitled "OLED Apparatus Including a Series of OLED Devices" by Yuan-Sheng Tyan; commonly assigned U.S. patent application Ser. No. 10/214,035 filed Aug. 7, 2002, entitled "Serially Connecting OLED Devices for Area Illumination" by Ronald S. Cok et al., the disclosures of which are incorporated herein by reference; and Appl. Phys. Lett. 82, 2580 (2003) can also be effectively used in combination with the present invention. In accordance with the present invention, an OLED device comprising two or more individual OLED elements monolithically connected in series is combined with a light integrator to achieve a white OLED apparatus. Each individual OLED element in the device is constructed to be a microcavity OLED device having a white organic EL element disposed between two metallic reflecting electrodes. All previous discussions regarding microcavity OLED devices are also applicable to the individual OLED element in the device.

The effectiveness of the present invention in utilizing the microcavity to enhance the OLED device output is illustrated in the following examples.

EXAMPLE 1

Conventional OLED—Comparative

The preparation of a conventional non-microcavity OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of $CF_x$, polymerized fluorocarbon, was deposited on the clean ITO surface as the hole-injecting layer by decomposing $CHF_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:
1) a hole transport layer, 107 nm thick, including N,N'-di (naphthalene-1-yl)-N,N'-diphenyl-benzidine (NPB);
2) an electron transport layer (also serving as the emissive layer), 62 nm thick, including tris(8-hydroxyquinoline) aluminum(III) (Alq);
3) an electron injection layer, 1 nm thick, including Li; and
4) a cathode, approximately 50 nm thick, including Ag.

After the deposition of these layers, the device was transferred from the deposition chamber into a dry box for encapsulation. The completed device structure is denoted as glass/ITO(42)/CFx(1)/NPB(107)/Alq(62)/Li(1)/Ag(50).

Figure 6:
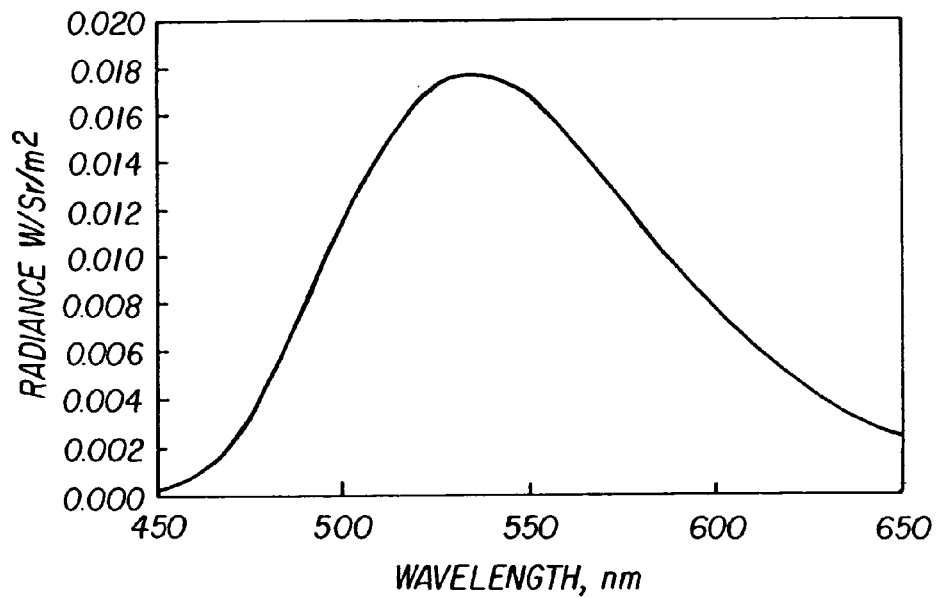
FIG. 6 shows the spectral output of a prior art non-microcavity OLED device.

This bottom-emitting device requires a driving voltage of 8.2 V to pass 20 mA/cm², its luminance efficiency is 4.35 cd/A, the FWHM bandwidth is 100 nm, and the color coordinates are CIE-x=0.352, CIE-y=0.562. The emission spectrum at 20 mA/cm² is shown in FIG. 6. The emission is nearly Lambertian, with little angular dependence. The Alq based OLED device was not white and had a green emission, but the emission spectrum was wide covering a range from 450 nm to over 650 nm. It was used conveniently to illustrate the utility of the present invention.

EXAMPLE 2

Conventional Microcavity OLED Device

A conventional microcavity OLED was fabricated as follows: A glass substrate was coated with a semitransparent anode layer, 22.5 nm thick, including Ag, by a DC sputtering process at an Ar pressure of about 4 mTorr. A 0.5 nm thick layer of molybdenum oxide, $MoO_3$, was deposited as a hole-injecting layer on the surface of the Ag anode layer in a vacuum chamber using thermal evaporation. The following layers were deposited in the following sequence by sublimation from a heated boat under a vacuum of approximately $10^{-6}$ Torr:
1) a hole transport layer, 430 nm thick, including N,N'-di (naphthalene-1-yl)-N,N'-diphenyl-benzidine (NPB);

2) an electron transport layer (also serving as the emissive layer), 70 nm thick, including tris(8-hydroxyquinoline) aluminum(III) (Alq);
3) an electron injection layer, 1 nm thick, including Li; and
4) a cathode, approximately 75 nm thick, including Ag.

After the deposition of these layers, the device was transferred from the deposition chamber into a dry box for encapsulation. The completed device structure is denoted as Glass/Ag(22.5)/MoO$_3$(0.5)/NPB(430)/Alq(70)/Li(1)/Ag(75).

Figure 7:
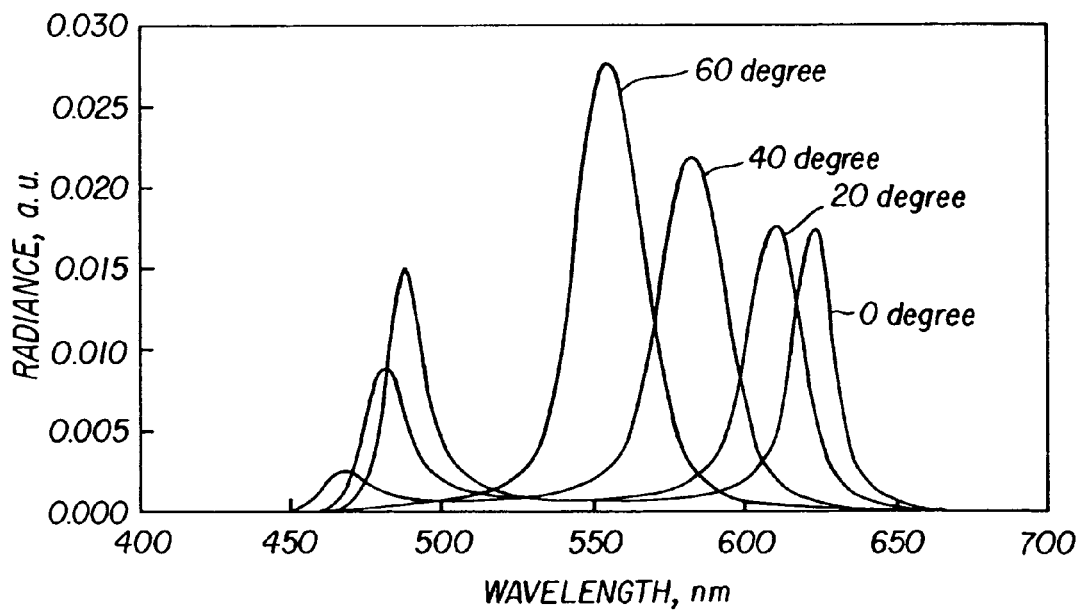
FIG. 7 shows the spectral output of a prior art microcavity OLED device.

At 20 mA/cm$^2$, this device required a driving voltage of 10.1 Volts. In the direction normal to the device, the emission output efficiency was 1.7 cd/A, and the color coordinates were CIE-x=0.454, CIE-y=0.351. The emission spectrum at 10 mA/cm$^2$ is shown as a function of angle in FIG. 7. The emission was a strong function of angle, and at each angle, the emitted light including two narrow peaks. The microcavity structure transformed the broadband emission of Alq into narrow-band, angular dependent emission. This emission behavior typifies those of conventional microcavity OLED devices. Thus, the conventional OLED device clearly was not appropriate for white light applications.

EXAMPLE 3

Figure 8:
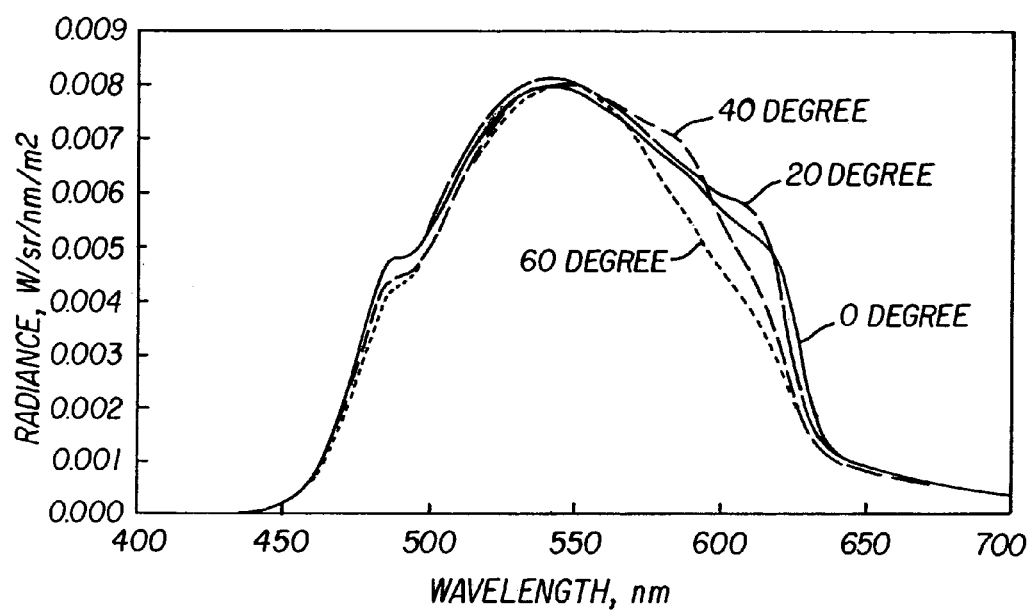
FIG. 8 shows the spectral output of a microcavity OLED apparatus according to the present invention.

The comparative microcavity OLED device of Example 2 was used to construct the broadband-emitting OLED apparatus of this example. A piece of 0.125 mm thick Teflon foil was optically attached using vacuum grease to the outside surface of the glass substrate of the microcavity OLED device of Example 2. The resulting output spectra at different angles are shown in FIG. 8. The emission showed little angular dependence and the spectral output resembled that of the Alq emitter as shown in Example 1 and FIG. 6. The total integrated output over all angles is expected to show similar shape and to cover a wide wavelength range from 450 nm to 650 nm. Because of the green Alq organic EL element used in the example, the resulting output was green and not white. The ability of the OLED apparatus to reproduce the spectral output of the emitter, however, clearly demonstrated that a white-emitting OLED apparatus would have resulted if a white emitting organic EL element had been used. In this example, the 0.125 mm Teflon foil served as both the integrating element and TIFR. It broadened the spectral output of the apparatus and reduced its angular dependence.

The invention has been described in detail with particular reference to certain preferred embodiments thereof, but it will be understood that variations and modifications can be effected within the spirit and scope of the invention.

PARTS LISTS

10 OLED device
20 substrate
25 total-internal-reflection-frustrater
30 bottom electrode
35 transparent conductive spacer layer
40 hole-injecting layer
45 hole-transporting layer
50 light emitting layer
55 electron-transporting layer
60 electron-injecting layer
70 organic EL element
85 bottom electrode
90 top electrode
95 light-integrating element
100 white microcavity OLED apparatus
105 light
110 reflected light
115 light
120 partially reflected light
125 partially transmitted light
130 emitted light
140 partially transmitted light
200 OLED device
210 first color emitter
220 second color emitter

What is claimed is:

1. A white light emitting OLED apparatus comprising a microcavity OLED device and a light-integrating element, wherein the microcavity OLED device has a white light emitting organic EL element and the microcavity OLED device is configured to have angular-dependent narrow-band emission, and the light-integrating element integrates the angular-dependent narrow-band emission from different angles from the microcavity OLED device to form white light emission wherein the microcavity OLED device comprises:
   a) a substrate having a first surface and a second surface;
   b) a metallic bottom electrode disposed over the first surface of the substrate;
   c) a metallic top electrode spaced from the metallic bottom electrode;
   d) a white light emitting organic EL element wherein the organic EL element comprises multiple light emitting layers disposed between the metallic top electrode and the metallic bottom electrode, wherein one of the metallic electrodes is semitransparent and the other one is substantially opaque and reflective; and
   e) wherein the metallic electrodes form a microcavity structure that converts the white light emission into angular-dependent narrow-band light.

2. The white light emitting OLED apparatus of claim 1 wherein the microcavity OLED device is tuned to have in the normal direction a peak emission wavelength larger than 600 nm or less than 500 nm.

3. The white light emitting OLED apparatus of claim 1 wherein the organic EL element has a stacked structure.

4. The white light emitting OLED apparatus of claim 1 wherein the light-integrating element is spaced from the microcavity OLED device.

5. The white light emitting OLED apparatus of claim 1 wherein the light-integrating element is attached to the microcavity OLED device.

6. The white light emitting OLED apparatus of claim 1 wherein the light-integrating element has a light scattering structure.

7. The white light emitting OLED apparatus of claim 1 wherein the light-integrating element comprises inclusions dispersed in a matrix wherein the refractive indexes of the inclusions are different from those of the matrix.

8. The white light emitting OLED apparatus of claim 1 wherein the light-integrating layer elements comprises a plastic matrix loaded with one or more white pigments.

9. The white light emitting OLED apparatus of claim 8 wherein the white pigment is TiO$_2$.

10. The white light emitting OLED apparatus of claim 1 wherein the light-integrating element comprises a plastic layer selected from high density polyethylene, low density polyethylene, ETFE, polystyrene, and polypropylene.

11. The white light emitting OLED apparatus of claim 1 wherein the light-integrating element comprises a surface light scattering structure.

12. The white light emitting OLED apparatus of claim 1 wherein the microcavity OLED device includes a total-internal-reflection-frustrating element.

13. The white light emitting OLED apparatus of claim 12 wherein the total-internal-reflection-frustrating element comprises a light scattering element.

14. The white light emitting OLED apparatus of claim 12 wherein the microcavity OLED device is bottom-emitting and a total-internal-reflection-frustrating element is disposed over the second surface of the substrate.

15. The white light emitting OLED apparatus of claim 12 wherein a total-internal-reflection-frustrating element is disposed close to the semitransparent electrode of the OLED device.

16. The white light emitting OLED apparatus of claim 12 wherein the total-internal-reflection-frustrating element comprises inclusions dispersed in a matrix wherein the refractive indexes of the inclusions are different from those of the matrix.

17. The white light emitting OLED apparatus of claim 12 wherein the total-internal-reflection-frustrating element comprises a plastic matrix loaded with one or more white pigments.

18. The white light emitting OLED apparatus of claim 17 wherein the white pigment is $TiO_2$.

19. The white light emitting OLED apparatus of claim 12 wherein the total-internal-reflection-frustrating element comprises a plastic layer having crystalline and amorphous regions having different refractive indexes.

20. The white light emitting OLED apparatus of claim 12 wherein the total-internal-reflection-frustrating element comprises a plastic layer selected from high density polyethylene, low density polyethylene, ETFE, polystyrene, and polypropylene.

21. The white light emitting OLED apparatus of claim 12 wherein the total-internal-reflection-frustrating element comprises a surface light scattering structure.

22. The white light emitting OLED apparatus of claim 12 wherein the total-internal-reflection-frustrating element comprises lens elements.

23. The white light emitting OLED apparatus of claim 12 wherein the total-internal-reflection-frustrating element comprises a diffusing reflecting element.

24. The white light emitting OLED apparatus of claim 12 wherein the total-internal-reflection-frustrating element also serves as the light-integrating element.

25. The white-light emitting OLED apparatus of claim 1 wherein the microcavity OLED device has a monolithically integrated serial connection structure.

26. The white light emitting OLED apparatus of claim 1 wherein the microcavity OLED device has two or more emitting regions each one of which is tuned to emit a different angular-dependent narrow-band emission spectrum.

27. The white light emitting OLED apparatus of claim 1 wherein the microcavity OLED device has two or more emitting regions with at least one region having a peak emission wavelength larger than 550 nm and one region having a peak emission wavelength less than 550 nm.

28. A white light emitting OLED apparatus comprising a microcavity OLED device and a light-integrating element, wherein the light-integrating element comprises lens elements, and wherein the microcavity OLED device has a white light emitting organic EL element and the microcavity OLED device is configured to have angular-dependent narrow-band emission, and the light-integrating element integrates the angular-dependent narrow-band emission from different angles from the microcavity OLED device to form white light emission.

29. A white light emitting OLED apparatus comprising a microcavity OLED device and a light-integrating element, wherein the microcavity OLED device has a white light emitting organic EL element and the microcavity OLED device is configured to have angular-dependent narrow-band emission, and the light-integrating element integrates the angular-dependent narrow-band emission from different angles from the microcavity OLED device to form white light emission wherein the microcavity OLED device comprises:

a) a substrate having a first surface and a second surface;

b) a metallic bottom electrode disposed over the first surface of the substrate;

c) a metallic top electrode spaced from the metallic bottom electrode;

d) a white light emitting organic EL element including a light-integrating element including a plastic layer having crystalline and amorphous regions having different refractive indexes disposed between the metallic top electrode and the metallic bottom electrode. wherein one of the metallic electrodes is semitransparent and the other one is substantially opaque and reflective; and e) wherein the metallic electrodes form a microcavity structure that converts the white light emission into angular-dependent narrow-band light.

* * * * *